(12) United States Patent
Fang

(10) Patent No.: US 6,972,583 B2
(45) Date of Patent: Dec. 6, 2005

(54) METHOD FOR TESTING ELECTRICAL CHARACTERISTICS OF BUMPS

(75) Inventor: Jen-Kuang Fang, Pin Tung Hsien (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 112 days.

(21) Appl. No.: 10/144,496

(22) Filed: May 13, 2002

(65) Prior Publication Data

US 2003/0094966 A1 May 22, 2003

(30) Foreign Application Priority Data

Nov. 16, 2001 (TW) ........................................ 90128498 A

(51) Int. Cl.$^7$ ............................................. G01R 31/26
(52) U.S. Cl. ...................................................... 324/765
(58) Field of Search ............................. 324/765, 158.1, 324/754, 761, 762, 757, 763

(56) References Cited

U.S. PATENT DOCUMENTS

| | | | | |
|---|---|---|---|---|
| 5,554,940 A | * | 9/1996 | Hubacher | 324/765 |
| 5,633,122 A | * | 5/1997 | Tuttle | 430/317 |
| 5,917,197 A | * | 6/1999 | Alswede et al. | 257/48 |
| 5,929,650 A | * | 7/1999 | Pappert et al. | 324/763 |
| 5,956,567 A | * | 9/1999 | Tomita | 438/18 |
| 6,127,729 A | * | 10/2000 | Fukuda | 257/736 |
| 6,207,477 B1 | * | 3/2001 | Motooka et al. | 438/113 |
| 6,300,577 B1 | * | 10/2001 | Tsujii | 174/261 |
| 6,327,158 B1 | * | 12/2001 | Kelkar et al. | 361/779 |

FOREIGN PATENT DOCUMENTS

| | | | | | |
|---|---|---|---|---|---|
| JP | 06085019 A | * | 3/1994 | | H01L/21/66 |
| JP | 06151535 A | * | 5/1994 | | H01L/21/66 |

* cited by examiner

Primary Examiner—Evan Pert
Assistant Examiner—Tung X. Nguyen
(74) Attorney, Agent, or Firm—Ladas & Parry LLP

(57) ABSTRACT

The present invention discloses a test method for the electrical characteristics of the bumps on wafer. That is, the bumps on the scribe lines and the bumps on the neighbor chips are in the status of electrical connections, therefore the electrical characteristics of the bumps on the neighboring chips could be verified by utilizing a probe to touch the bumps on the scribe lines. Because the bumps on the neighboring chips are not really contacted with the probe, the intact profile of the bumps on the neighboring chips certainly keeps the same.

9 Claims, 3 Drawing Sheets

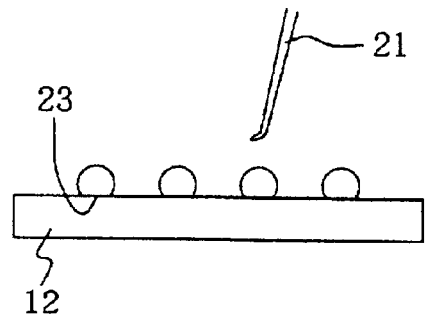
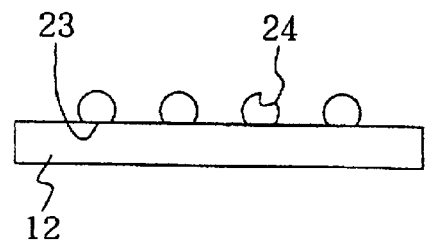
FIG. 2(a) (Prior Art)   FIG. 2(b) (Prior Art)
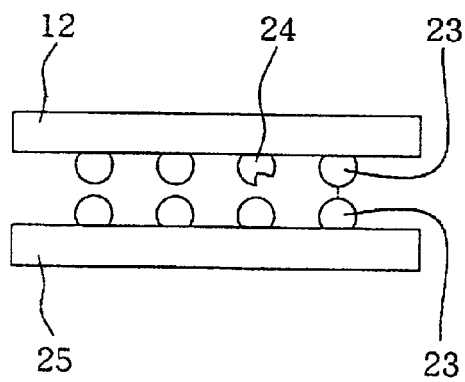
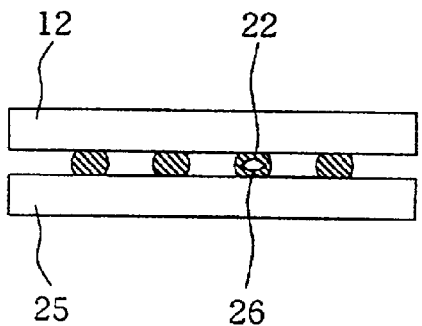
FIG. 2(c) (Prior Art)   FIG. 2(d) (Prior Art)

METHOD FOR TESTING ELECTRICAL CHARACTERISTICS OF BUMPS

BACKGROUND OF THE INVENTION

1. Field of the Invention

The present invention relates to a testing method for semiconductor device, especially to a testing method for the electrical characteristics of the bumps on wafer.

2. Description of the Related Art

As for the increasing requirement for the portability of consumer electronic products, the flip-chip technique definitely provides the best method to achieve the purpose for lightening, thinning, shortening and shrinking electrical products. For this technique, it is a very important issue about how to increase the stability and reliability for the electrical characteristics of the bumps. If the bumps had bad connections, it will influence the electrical performances and the lifetime of the consumer electronic products.

After the completion of the front-end wafer manufacture process and before the back-end package process, the electrical characteristics of each chip 12 have to be tested on the wafer 11 first, as shown in FIG. 1. If there are defects on the electrical characteristics for the chip 12, it will be marked on the surface of the chip 12 and, after the wafer 11 had been sawed, the defected chip 12 will be rejected or employed in other downgrade applications. Conventionally, when testing the electrical characteristics of each chip 12, a probe 21, as shown in FIG. 2(a), was directly contacted with the bump 23 of each chip 12. The material of the bump 23 may be a metal, such as gold or solder, that can be produced by electroplating, sputtering or printed bumping, which is used to connect the pad of the chip 12 for communicating the electric signals to the substrate 25 or other chips. The signals abstracted by the probe 21 are verified by a test program on a testing machine (not shown).

The conventional testing method, however, resulted in many problems, referred to FIGS. 2(a)~2(d). Because during the testing process, the probe 21 was downwards contacted and pressed onto the bump 23, it would be liable to cause a recess 24 at the contact area of the bump 23, as shown in FIG. 2(b). Then, during the succeeding reflow process for the chip 12 and the substrate 25, the recess 24 would possibly form voids or bubbles 26 within the melted bump 22 and further result in bad electrical connection or function failure. In other words, even the chip 12 could pass the electrical testing; it would be prematurely failed in the succeeding operation caused by inferior reliability.

SUMMARY OF THE INVENTION

The object of the present invention is to provide a reliable testing method for the electrical characteristics of the bumps, thereby not only normally conducting the probe test but also reducing the defects from bad welding and increasing the product reliability.

In order to achieve the aforementioned object, the present invention discloses a testing method for the electrical characteristics of the bumps that can be practically applied to the package process for the electronic devices. The method includes the following steps: first, using a specially designed photomask in the wafer manufacture process for conducting the processes, such as exposure, developing and etching; forming the pads, are electrically connected to the other pads on the neighboring chips, on the scribe line located between mutually neighboring chips; after the flip-chip bumping processing, the wafer being formed with bumps on all the pads on chips and on the scribe lines.

To verify whether each of chips is qualified by the electrical specifications and to identify the chips not conformed to the specifications, the testing method is used to mark or record the corresponding location of each chip so as to sort the unqualified ones for rejecting or specially treating in the succeeding processes. Because the bumps on the scribe lines and the bumps of neighboring chips are electrically connected, it may take advantage of a probe to respectively contact the surface of the corresponding bump on the scribe line to obtain the electrical characteristics of the bumps of neighboring chips. Because the bumps of neighboring chips are not really contacted with the probes, the intact profile for the bumps on the chips can be assuredly kept so as to solve the problems in the prior art.

BRIEF DESCRIPTION OF THE DRAWINGS

The invention will be described according to the appended drawings in which:

FIGS. 2(a)~2(d) are schematic representations of a prior art testing method;

PREFERRED EMBODIMENT OF THE PRESENT INVENTION

Figure 1:
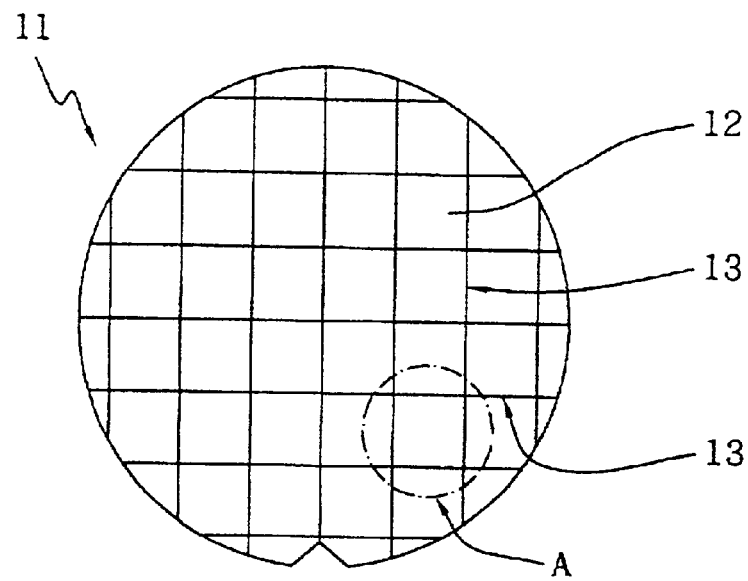
FIG. 1 is a schematic representation of a prior art semiconductor wafer.
Figure 3:
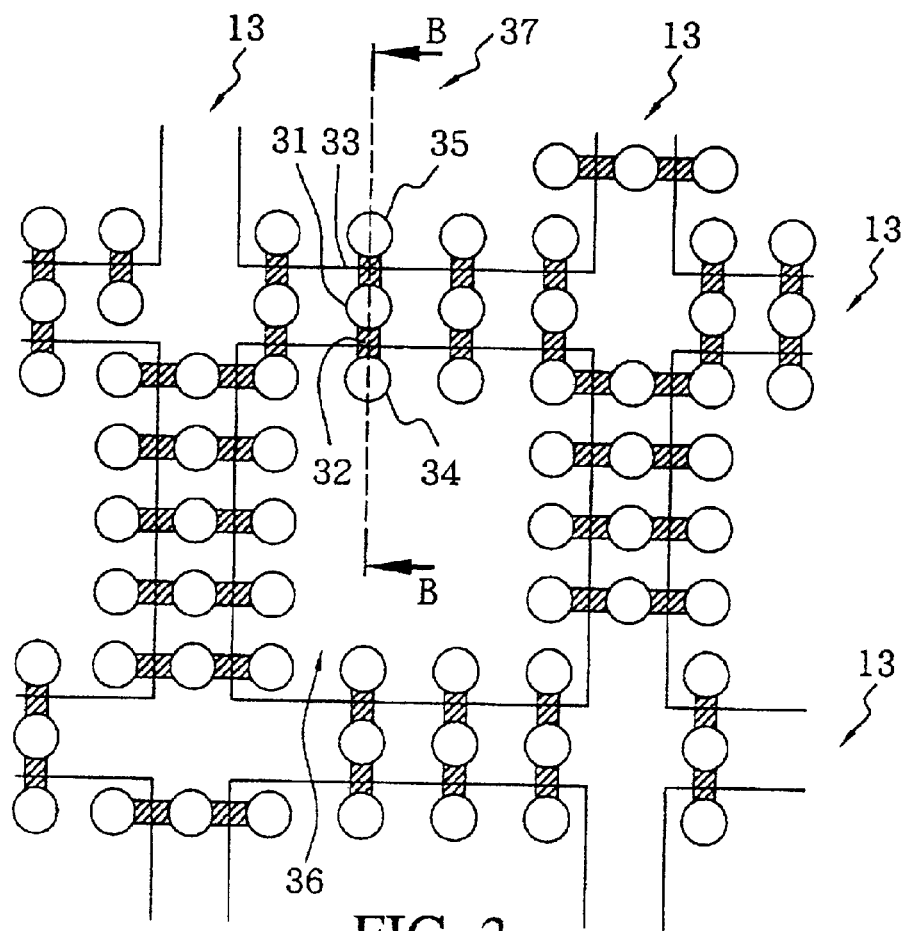
FIG. 3 is a schematic representation in accordance with the invention that illustrates the electrical connections of the bumps on the scribe lines with the bumps of neighboring chips.

FIG. 3 illustrates an enlarged diagram corresponding to the "A" region of FIG. 1 according to the present invention. The technique of the present invention is characterized that the scribe line 13 between the chips 36 and 37 is bumped with the bump 31 and the bumps 34 and 35 are electrically connected to the bump 31 by a metal trace 32 and 33 respectively. Generally speaking, the scribe line 13 does not have any electrical functions but only provides the clearance during separating the neighboring chips 36 and 37 by sawing in the package process and the materials of the scribe line 13 will be removed after the sawing procedure. Furthermore, the widths of the scribe line 13 (about 3–5 mil) can only accommodate single rank of the bumps 31, but how many bumps 31 will be arranged on one rank depends on the circuit layout and the testing requirement. Because the bump 31 and the bumps 34 and 35 are mutually electrically connected, using the probe 21 to contact the surface of the bump 31 can premeditatedly obtain the electrical characteristics of the bumps 34 or 35.

Figure 4A:
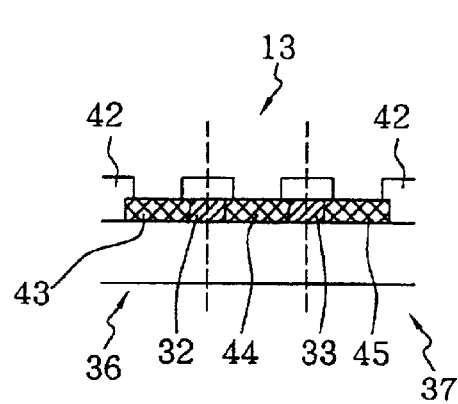
FIGS. 4(a)~4(d) are procedure representations of the testing method in accordance with the invention.
Figure 4B:
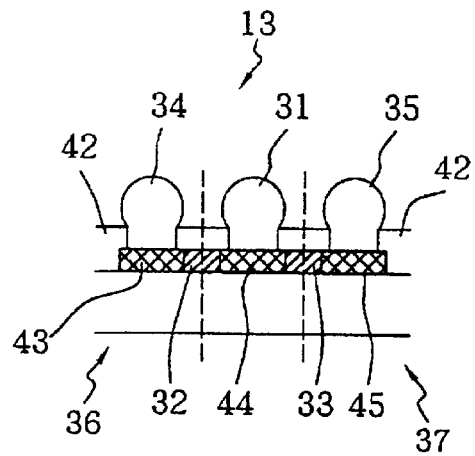
Figure 4C:
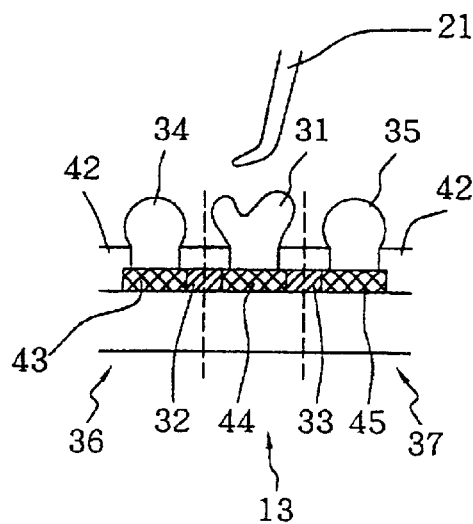
Figure 4D:
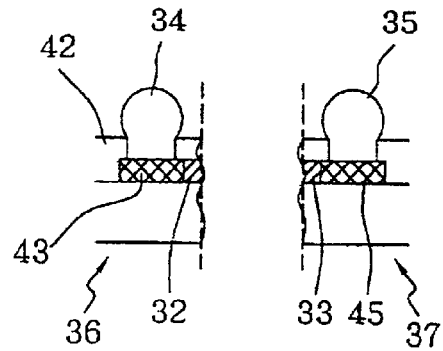

FIGS. 4(a)~4(d) are cross-sectional representations taken along line B—B in FIG. 3 for the electrical testing procedures applied to the bumps. First, the photomask different from that of the prior art is used in the wafer manufacture process, and the designed pattern of the photomask depends on the circuit design rules and the practical testing requirements. The purpose is to employ the same processes (such as photoresist coating, exposure/developing, metal deposition and etching etc.) for forming the metal trace 32 on the neighboring chips 36 and 37 and the scribe line 13 crosswise. The metal traces 32 and 33 and the pads 43, 44 and 45 on the neighboring chips 36 and 37 are electrically connected with each other. Furthermore, a passive layer 42 is coated on the upmost surface for preventing from the damage due to moisture or particles. Next, after the flip-chip bumping process, bumps are respectively bumped on all the pads, as shown in FIG. 4(b). The pad 44 on the scribe line 13 and the pads 43 and 45 respectively on the chips 36 and 37 are electrically connected; in other word, the pads 43 and 44 are connected together by the metal trace 32, and the pads 45 and 44 are similar. Therefore, during testing the electrical characteristics for the bumps 34 and 35, it only needs to use the probe 21 to contact the bump 31 on the scribe line 13 in order to prevent from damaging the intact profile of the bumps 34 and 35, as shown in FIG. 4(c). The final test results need only be reserved by suitable marks (e.g. spotting on the corresponding chip with colored ink) or with mapping file. The scribe line 13 will be left a clearance by a sawing blade during the sawing of the package process, and the pad 44 and the bump 31 on the scribe line 13 will be removed, as shown in FIG. 4(d). In other words, even the bump 31 on the scribe line 13 was deformed by the contact of the probe 21, it finally will be cut off so that it will not influence the final electrical characteristics of the product.

The above-described embodiments of the present invention are intended to be illustrated only. Numerous alternative embodiments may be devised by persons skilled in the art without departing from the scope of the following claims.

What is claimed is:

1. A method for testing electrical characteristics of bumps, comprising the steps of:
    forming a plurality of pads on scribe lines between neighboring chips, and electrically connecting said plurality of pads on said scribe lines to pads of said neighboring chips;
    forming bumps on said plurality of pads on said scribe lines and said pads of said neighboring chips; and
    using a probe to directly contact at least one of said bumps on said plurality of pads on said scribe lines so as to test if electrical characteristics of at least one of said electrically connected bumps of said neighboring chips are acceptable.

2. The method of claim 1, wherein the material of pads is selected from the group consisting essentially of copper, aluminum and alloy thereof.

3. The method of claim 1, wherein the material of bumps is selected from the group consisting essentially of lead, gold and alloy thereof.

4. The method of claim 1, wherein said bumps are formed by electroplating, deposition or printing.

5. The method of claim 1, further comprising a step of cutting off said scribe lines, pads on said scribe lines and bumps on said pads on said scribe lines by a sawing blade.

6. The method of claim 1, and further comprising removing said probe from said contact.

7. The method of claim 1, further comprising the step of cutting off said scribe lines, pads on said scribe lines and bumps on said pads on said scribe lines.

8. A method for testing electrical characteristics of bumps, comprising the steps of:
    forming a plurality of pads on scribe lines between neighboring chips, and electrically connecting said plurality of pads on said scribe lines to pads of said neighboring chips;
    forming bumps on said plurality of pads on said scribe lines and said pads of said neighboring chips; and
    using a probe to contact at least one of said bumps on said plurality of pads on said scribe lines so as to test if electrical characteristics of at least one of said electrically connected bumps of said neighboring chips are acceptable.

9. A method for testing electrical characteristics of bumps, comprising the steps of:
    forming a plurality of pads on scribe lines between neighboring chips, and electrically connecting said plurality of pads on said scribe lines to pads of said neighboring chips;
    forming bumps on said plurality of pads on said scribe lines and said pads of said neighboring chips;
    using a probe to contact at least one of said bumps on said plurality of pads on said scribe lines so as to test if electrical characteristics of at least one of said electrically connected bumps of said neighboring chips are acceptable; and
    cutting off said pads on said scribe lines and said bumps on said pads on said scribe lines, whereby to remove probe-contact bump dents.

* * * * *